(12) United States Patent
Ullermann et al.

(10) Patent No.: US 10,021,788 B2
(45) Date of Patent: Jul. 10, 2018

(54) HIGH-CURRENT ELECTRICAL CIRCUIT HAVING A CIRCUIT BOARD AND A BUSBAR

(71) Applicant: Ellenberger & Poensgen GmbH, Altdorf (DE)

(72) Inventors: Wolfgang Ullermann, Schwabach (DE); Manuel Engewald, Nuremburg (DE); Markus Miklis, Pfeifferhuette (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days.

(21) Appl. No.: 15/338,647

(22) Filed: Oct. 31, 2016

(65) Prior Publication Data

US 2017/0048980 A1    Feb. 16, 2017

Related U.S. Application Data

(63) Continuation of application No. PCT/EP2015/059280, filed on Apr. 29, 2015.

(30) Foreign Application Priority Data

Apr. 30, 2014 (DE) .................. 10 2014 006 360

(51) Int. Cl.
*H01R 9/00* (2006.01)
*H05K 1/18* (2006.01)
(Continued)

(52) U.S. Cl.
CPC ............... *H05K 1/18* (2013.01); *H01B 5/02* (2013.01); *H01R 12/7088* (2013.01);
(Continued)

(58) Field of Classification Search
CPC ...... H01B 5/02; H01R 12/58; H01R 12/7088; H01R 25/161; H05K 1/0213; H05K 1/0263; H05K 1/18; H05K 2201/10272; H05K 2201/10409; H05K 7/1432
See application file for complete search history.

(56) References Cited

U.S. PATENT DOCUMENTS 5,263,247 A    11/1993  Adachi et al.
5,442,142 A *   8/1995  Hayashi ............... H05K 1/0263
                                                          174/250
(Continued)

FOREIGN PATENT DOCUMENTS

DE    10 2009 019 699 A1    11/2010
EP       0 590 643 B1         3/2002
(Continued)

OTHER PUBLICATIONS

Patial English Translation of Korean Office Action for Korean Application No. 10-2016-7032774 dated Mar. 20, 2018.

*Primary Examiner* — Yuriy Semenenko
(74) *Attorney, Agent, or Firm* — Muncy, Geissler, Olds & Lowe, P.C.

(57) ABSTRACT

An electrical circuit including a circuit board on which a number of electrical and/or electronic components are mounted, and a busbar that has a supporting body and a first, second, and third connection. The supporting body is spaced apart from the circuit board and the connections are brought into electrical contact both with the supporting body and with the circuit board. The supporting body has a first cross section between the first and second connection and a second cross section between the second and third connection, wherein the first cross section is smaller than the second cross section. The invention further relates to a bus bar.

14 Claims, 3 Drawing Sheets

(51) Int. Cl.
*H01R 12/70* (2011.01)
*H01R 25/16* (2006.01)
*H05K 1/02* (2006.01)
*H05K 7/14* (2006.01)
*H01B 5/02* (2006.01)
*H01R 12/58* (2011.01)

(52) U.S. Cl.
CPC ......... *H01R 25/161* (2013.01); *H05K 1/0213* (2013.01); *H05K 1/0263* (2013.01); *H05K 7/1432* (2013.01); *H01R 12/58* (2013.01); *H05K 2201/10272* (2013.01); *H05K 2201/10409* (2013.01)

(56) References Cited

U.S. PATENT DOCUMENTS

| | | | | |
|---|---|---|---|---|
| 5,795,193 A | * | 8/1998 | Yang | H01R 9/2458 439/620.27 |
| 6,494,723 B2 | * | 12/2002 | Yamane | B60R 16/0238 439/404 |
| 7,592,892 B2 | * | 9/2009 | Ito | H01H 85/045 337/159 |
| 8,337,251 B2 | * | 12/2012 | Ecker | H01H 85/044 439/620.27 |
| 8,469,724 B1 | | 6/2013 | Barnette et al. | |
| 9,083,094 B2 | * | 7/2015 | Teramoto | H01R 4/64 |
| 2008/0160840 A1 | * | 7/2008 | Bax | H01R 4/30 439/724 |
| 2011/0036624 A1 | | 2/2011 | Kagimura et al. | |
| 2014/0000960 A1 | * | 1/2014 | Kubota | H02G 5/00 174/71 B |

FOREIGN PATENT DOCUMENTS

| | | |
|---|---|---|
| EP | 1 291 983 A2 | 3/2003 |
| EP | 2 330 865 A1 | 6/2011 |
| JP | 2000-196214 A | 7/2000 |
| JP | 2006-032744 A | 2/2006 |
| JP | 2013-235757 A | 11/2013 |

* cited by examiner

HIGH-CURRENT ELECTRICAL CIRCUIT HAVING A CIRCUIT BOARD AND A BUSBAR

This nonprovisional application is a continuation of International Application No. PCT/EP2015/059280, which was filed on Apr. 29, 2015, and which claims priority to German Patent Application No. 10 2014 006 360.7, which was filed in Germany on Apr. 30, 2014, and which are both herein incorporated by reference.

BACKGROUND OF THE INVENTION

Field of the Invention

The invention relates to an electrical circuit comprising a circuit board on which a plurality of electrical and/or electronic components are mounted.

Description of the Background Art

Commercial vehicles, e.g., refrigerated trucks, have electrically operated auxiliary units such as in particular a refrigeration system or hoists. Switching of the current circuit supplying the particular unit is necessary for operation, and usually occurs by means of power semiconductor switches. The on-board system of commercial vehicles has an electrical voltage of 24 V. In order to supply relatively high-power auxiliary units as well, it is therefore necessary to switch relatively high currents. High-current circuit boards are typically used for this purpose, which have intermediate conductive layers with thick-copper technology with which the power semiconductors are electrically contacted. The thickness of these copper layers is up to 400 μm. The cost of producing circuit boards of this kind is relatively high.

A high-current circuit board arrangement is known from EP 0 590 643 B1, which corresponds to U.S. Pat. No. 5,442,142, which has a circuit board and a busbar, which is spaced apart from the circuit board. The fastening elements of the circuit board are supplied with current by means of the busbar.

SUMMARY OF THE INVENTION

It is therefore an object of invention to provide an electrical circuit, which can be manufactured cost-effectively and can be adapted advantageously to the most diverse requirements.

In an exemplary embodiment, the electrical circuit has a particularly plate-shaped circuit board, which has, for example, fiber-reinforced plastic with traces made of copper in particular. The layer thickness of the traces is suitably less than 140 μm, 70 μm, and, for example, less than or equal to 35 μm. In other words, none of the traces of the circuit board is thicker than 35 μm. The traces are located expediently only on one side of the plastic body made as a plate, also called a plastic plate hereafter, or on both of its surfaces. The circuit board expediently has no intermediate conductive layer. In particular the circuit board has no intermediate copper layer. A number of electrical and/or electronic components are mounted on the circuit board and these are electrically contacted in particular with one of the traces. Advantageously, the electrical or electronic components are in direct mechanical contact with one of the traces located on the surface of the plastic plate. An electrical component can be, for example, the smallest basic electrical circuit component regarded as a unit such as, e.g., passive or active components. In particular, electrical components can be, for example, resistors, capacitors, inductors, diodes, transistors, optocouplers, or relays. The components mounted on the circuit board suitably comprise at least one semiconductor, which is in particular a transistor and advantageously a MOSFET or an IGBT. An electronic component can be an electrical circuit, which, for example, is made discretely or integrated as a chip.

The electrical circuit can comprise further a busbar with a supporting body and with a first connection and with a second connection, as well as with a third connection. The supporting body is spaced apart from the circuit board and is arranged parallel to it, for example. In other words, the distance to the substantially plate-shaped circuit board is constant. The smallest distance between the supporting body and the circuit board expediently runs perpendicular to the circuit board. For example, all electrical/electronic components are mounted on one of the circuit board sides, and the busbar is also located on this side. Advantageously, in this case at least one of the components is disposed between the supporting body and the circuit board. This component is protected from damage in this way. Further, mounting of the electrical circuit in a housing is made easier. Alternatively, the busbar is located on the opposite side, so that the circuit board is situated between the components and the supporting body. Therefore, the busbar has relatively little influence on the components.

The supporting body and the connections include an electrically conductive material, and each connection is electrically contacted both with the supporting body and the circuit board. In particular, the connections are attached directly both to the supporting body and to the circuit board, therefore in direct mechanical contact. For example, each of the connections is electrically contacted with a trace placed on a surface of the plastic plate of the circuit board. Traces, assigned to each connection, are suitably insulated electrically from one another or electrically connected at least by means of at least one electrical or electronic component. In other words, the traces are not short-circuited.

The contact points of the connections with the supporting body are in each case spaced apart from one another, whereby the contact points are arranged preferably along a straight line. In this case, the first connection is placed adjacent to the second connection and the third connection adjacent to the second connection. In the current flow direction along the busbar and/or spatially, the second connection is located between the first connection and the third connection. The supporting body has a first cross section between the first connection and the second connection and a second cross section between the second connection and the third connection, the first cross section being smaller than the second cross section. In other words, the area of the second cross section is greater than the area of the first cross section. In particular, only the area is used for this that is filled with material, therefore suitably the part of the supporting body that is made solid. For example, the shape of the first cross section is similar to the shape of the second cross section, whereby the scale differs. In other words, the second cross section is similar to the first cross section, which is made larger in at least one dimension.

The particular cross section in this case can be determined expediently perpendicular to the shortest connection and/or perpendicular to the current flow direction between the particular connections. In particular, the first cross section is parallel to the second cross section. The phrase "between the first connection and the second connection" designates in particular the part of the supporting body that is located between the electrical contact points of the first connection and of the second connection with the supporting body. For example, the cross section of the supporting body between the first and second connection is constant at least in sections, but advantageously along the entire stretch. Alternatively or in combination, the cross section of the supporting body between the second and third connection is constant. In particular, the supporting body is formed step-shaped, whereby the step is located at the contact point of the second connection. As an alternative to this, the cross section between two adjacent connections decreases continuously, whereby the cross section of the supporting body in the area of the first connection is smaller than in the area of the second connection and this in turn is smaller than in the area of the third connection. In particular, the supporting body in this case is designed substantially triangular, whereby the cross section is rectangular, for example. The triangle is preferably a right triangle and one of the two legs is longer, in particular by more than double, than the other leg. The contact points of the connections are located expediently on the lengthened leg, and the particular cross section is determined preferably perpendicular to this leg.

Based on the use of the busbar, it is made possible to use a relatively cost-effective circuit board and, nevertheless, to switch relatively high currents by means of the electrical circuit. The electrical circuit can also be used relatively universally. To adapt to the currents to be switched, only the current-carrying capacity of the busbar and not the circuit board layout need to be changed. Development costs are reduced as a result. Further, possible sources of error are avoided, which could arise due to the adapting of an already existing topography of the electrical circuit to different current strengths, because only the relatively robust, simple, and non-error-prone busbar needs to be changed. Because of the changed cross section of the supporting body, the material requirement of the busbar is reduced, which leads to lower material costs and a reduced weight. An improved air circulation to the circuit board is also achieved in this way.

The electrical circuit can be a part of a motor vehicle and in particular of a commercial vehicle. Suitably, in this case, the electrical circuit is part of a current circuit by means of which an electrical auxiliary unit is operated. The electrical circuit in this case is part of a relay for switching the electrical current. Expediently, the busbar is provided and configured to safely carry an electrical current of over 5 A, 10 A, 20 A, 50 A, 100 A, 150 A, 200 A, or 250 A and up to 300 A. Suitably, the busbar is provided and configured to safely carry an electrical current greater or equal to 300 A, 350 A, 400 A, 450 A, 500 A, or more. For example, an applied electrical voltage is equal to 12 V, 24 V, or 48 V and preferably lower than 60 V. In particular, the busbar is designed such that in the case of an electrical current with a current strength of 300 A and an electrical voltage of 24 V no destruction of the busbar occurs, even if an electrical current of this type is applied for a relatively long time period.

The electrical circuit can have two such busbars, which are electrically contacted with one another by at least one part of the electrical/electronic components. As a result, these components are connected parallel to one another, whereby each of these components is electrically contacted in particular with the two busbars and in each case with one of the busbar connections, suitably by means of one of the traces. In this case, in particular one of the components is electrically contacted with the first connection of the one busbar and with a connection of the further busbar, said connection not being the first connection of the further busbar. For example, this component is electrically contacted with the first connection of the one busbar and the third connection of the further busbar. Preferably, in this case, the second connection of the one busbar and the second connection of the further busbar and the third connection of the one busbar and the first connection of the further busbar are electrically contacted in each case by one of the components. The component(s) is/are expediently semiconductor switches, e.g., transistors and preferably MOSFETs or IGBTs.

The busbar can be made as a single piece, and the connections are therefore formed on the supporting body. The robustness of the busbar is increased in this way. Expediently, the supporting body and in particular the complete busbar can be formed of a single material. In other words, the specific resistance of the supporting body is constant. As a result, the electrical resistance of the supporting body between the first and second connection is greater than between the second and third connection. A distribution of the electrical current on the circuit board is simplified in this way. The busbar is suitably made as stamped/bent part, therefore stamped out of a material and bent into a suitable form. Consequently, the production of the busbar is relatively cost-effective. In a preferred embodiment of the invention, the busbar can be formed of copper, which leads to a relatively low electrical resistance of the busbar and thereby to a high current-carrying capacity. Copper here can be pure copper but, however, also any copper alloy. Suitably, the busbar can be formed of nickel-plated copper, therefore a copper body that is coated with a nickel layer. Oxidation of the copper is prevented in this way, and electrical contacting of the busbar is simplified. Alternatively or in combination, the busbar is tin-plated and/or silver-plated.

In an embodiment of the invention, one end of the supporting body forms the contact of the first connection, and in particular the supporting body merges into the first connection. Expediently, the first cross section is the smallest cross section of the supporting body and/or the same as the cross section of the first connection. Thus, the supporting body has the greatest electrical resistance between the second and first connection. For example, one of the ends of the supporting body has an opening. The opening is expediently round. An attachment site for an electrical cable is created by the opening, whereby the attachment is relatively robust. Advantageously, a threaded bolt is situated at least partially within the opening, therefore inserted in the opening. A cable lug in particular is attached to the supporting body by means of the threaded bolt. To this end, a force-locking connection between the cable lug and the supporting body is expediently created by means of the threaded bolt and a nut. The cable lug for its part is advantageously attached to an electrical cable and electrically contacted with it. A relatively robust electrical contacting of the busbar, which is relatively temperature-stable and moreover disconnectable, is made possible in this way. Only a relatively simple and not space-intensive tool is needed for producing the electrical contact. Alternatively, the electrical cable is soldered or welded with the busbar.

In an embodiment of the invention, one of the ends of the supporting body has the opening and the other end of the supporting body has the contact of the first connection, whereby the supporting body in particular is elongated, and the ends indicate the respective closure in the direction of the extension. In this way, the electrical resistance between the third connection and the second connection is smaller than between the second connection and the first connection, so that a resistance conductor is realized by the busbar. In particular, the busbar can be formed of a single material and is preferably made as a stamped/bent part. Consequently, the resistance string is realized without other electrical components and is produced relatively rapidly and cost-effectively.

The busbar can comprise at least one further connection, which is electrically contacted with the supporting body directly adjacent to the third connection and in particular is attached to said body. In this regard, the third connection is positioned between the second connection and the further connection. The supporting body between the third connection and the further connection expediently has a cross section that is greater than the second cross section. In particular, the busbar has a number of further connections, which in each case adjacent to one another along the supporting body are contacted with said body and in particular are attached to it. In this regard, the supporting body between adjacent connections in each case has a cross section that is increased with an increasing distance to the first connection. In other words, in particular the cross section of the supporting body increases continuously with an increasing distance to the first connection, whereby between adjacent connections the cross section is either constant or also increases substantially continuously. Each of the further connections, moreover, is contacted with the circuit board, so that a plurality of electrical connections to the circuit board are provided.

The cross section of each connection can be constant, whereby the cross section is determined perpendicular to the current flow direction. In particular the cross section of all connections is equal in size and corresponds, e.g., to the first cross section. As a result of this, each connection when fabricated from the same material has the same electrical resistance. For example, the distance between the contacts of adjacent connections with the supporting body is the same. In other words, the distance between the contacts of the first and second connection is equal to the distance between the contacts of the second and third connection. Provided further connections are present, in this case, the distance between adjacent connections is equal to the distance between the contact of the first connection and the contact of the second connection in each case with the supporting body. Manipulation of the busbar is simplified in this way and the electrical resistance between adjacent connections with a suitable material choice depends substantially only on the cross section of the supporting body.

For example, each connection can have a number of pins. A pin can be a cylindrical protrusion. Suitably, each connection can include the particular pins or has further parts, which are situated between the pins and the contact with the supporting body. The pins are pressed into appropriate first openings of the circuit board. In particular, the edges of the first openings are electrically conductive and expediently part of at least one trace of the circuit board. A force-locking connection is realized between each pin and the perimeter of the opening because of the pressing in, so that the electrical contacting between the connection and the circuit board occurs without the help of other aids such as, e.g., solder. Owing to the use of a number of pins, these are consequently connected to one another in an electrically parallel manner, and the load of each individual pin is reduced, so that these can be made relatively delicate. In particular the pins are designed as springy, suitably perpendicular to press-in direction, which makes pressing in easier. A tolerance compensation is also produced in this way. In particular, each pin can have a material that has spring-elastic properties. For example, each pin is slit with the formation of two parallel legs, whereby the slit is parallel to the press-in direction and expediently not opened at its ends. The legs are formed curved or with a bulge perpendicular to the press-in direction, whereby the convexity of the two legs is oppositely directed. In this way, each pin is designed relatively simply and cost-effectively as springy and makes attachment to the circuit board easier. Alternatively to the pressing in, the pins are soldered in the corresponding first openings and subsequently fixed with solder. A relatively cost-effective material for creating the pins can be used in this way.

Suitably, the supporting body has an L-shaped cross section over its entire length. For example, the first cross section and the second cross section are each L-shaped, whereby in particular one leg formed in this manner is parallel to the plate-shaped circuit board. As a result, on the one hand, the overall height of the electrical circuit is reduced and, on the other, the stability of the busbar is increased. In particular, the cross section of the supporting body in the area of the contacts of the connections is formed by means of two legs which are spaced apart and are arranged in particular perpendicular to one another. In other words, the area of the direct mechanical contact between the two legs is recessed. As a result, the supporting body in the area of the contacts has recesses in each case. An engagement point for a tool for attaching the busbar to the circuit board is created by the recesses.

In particular, to mount the electrical circuit, parts of the busbar are pressed into corresponding recesses of the circuit board. For example, there are pins and first openings. In this regard, the pins are arranged in the press-in direction before the particular recesses, so that the pins are pressed into the first openings by exerting force on the perimeter of the recess. As a result, the busbar is not deformed during mounting on the circuit board. Further, material in the area of the L-shaped bend is removed by the recesses, so that bending of the supporting body into the L-shape is facilitated.

Each connection can have a spring element, which is situated between the contact with the supporting body and the circuit board. Thus, a tolerance element is created, and movement of the supporting body relative to the circuit board is enabled to a limited extent, without the electrical circuit being damaged. In particular, during use in the automotive sector, the electrical circuit therefore is also not damaged when driving over relatively poor streets or in well-tried driving maneuvers. In particular, each connection is bent into an L-shape and, for example, the particular spring element is realized in this way. Expediently, one of the legs of each connection is parallel to the circuit board and lies expediently against the circuit board. In other words, this leg substantially over its entire length is in direct mechanical contact with the circuit board. In this way, a relatively secure connection of the busbar to the circuit board is made possible and the position of the busbar relative to the circuit board is stabilized. A working area for a tool for mounting the busbar on the circuit board is also created in this way.

The leg, parallel to the circuit board, of each connection can have a contact pin, which is perpendicular to the circuit board and points toward it. Advantageously, each contact pin in the state of mounting is pressed into a corresponding second opening, whereby the edge of the second opening is particularly electrically conductive and suitably part of a trace of the circuit board. Alternatively, only the mechanical attachment of the connection to the circuit board occurs by means of the contact pin, whereas the electrical contacting occurs by means of a further region of the leg parallel to the circuit board by means of placement of the leg on a trace of the circuit board. Because of the parallelism of the leg relative to the circuit board, a pressing in by exertion of force on the leg, made larger in comparison with the second opening, is simplified. For example, the cross section of the pin parallel to the circuit board is square, whereby the corners are rounded. Preferably, the pin is hollow in this case, and expediently each edge is slit, so that the corners, each being rounded, can be bent in the direction of the center point. Thus, with a suitable material selection a force-locking connection between the particular connection and the circuit board is produced relatively simply by means of elastic bending of the corners.

The contact pin can be created by a joggle. In other words, the contact pin is pressed out of the leg by exertion of force on the opposite side of the leg. The contact pin is produced relatively simply in this way, and the contact pin need not be attached in a relatively time-consuming manner. Thus, adaptation of the busbar to the particular circuit board is also relatively simple. For example, the contact pin is produced by embossing.

The busbar can have a supporting body and a first and also a second and third connection. The connections are each electrically contacted with the supporting body and in particular attached to said body. In this case, the second connection adjacent to both the first connection and the third connection is contacted with the supporting body. The first connection is not directly adjacent to the third connection. Rather, the second connection is situated between them. The individual connections are connected parallel to one another. The supporting body has a first cross section between the first and second connection and a second cross section between the second and third connection. In this case, the first cross section is smaller than the second cross section. In other words, the area of the first cross section is smaller than the area of the second cross section, whereby in particular only the part of the cross section that is filled with material contributes to the determination of the area. Therefore, this is the part of the supporting body that is formed of a solid material.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
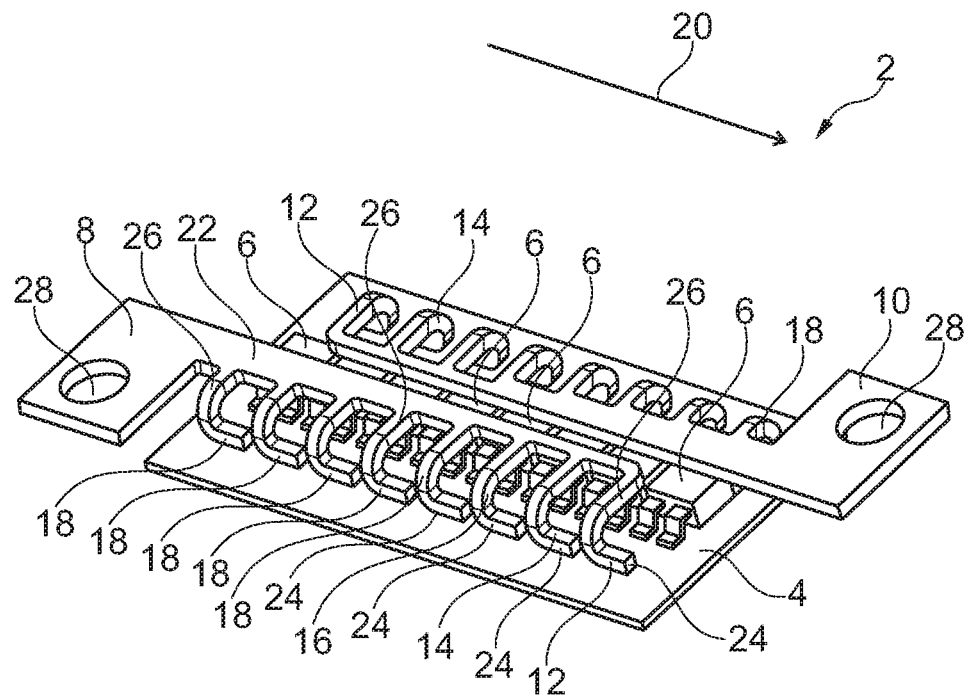
FIG. 1 shows perspectively an electrical circuit with two busbars.

An electrical circuit 2 with a plate-shaped circuit board 4 is shown perspectively in FIG. 1. Circuit board 4 comprises a plate made of a fiber-reinforced plastic, for example, fiberglass cloth, which is impregnated with epoxy resin. A copper layer, which is partially removed to create traces (not shown), is applied to the plastic plate. In other words, circuit board 4 has a printed circuit. Electrical circuit 2 comprises further electrical components 6, of which eight transistors in the form of MOSFETs are shown. Electrical circuit 2 further has a first busbar 8 and a second busbar 10, which have the same structure and are fastened to circuit board 4. In this case, second busbar 10 is positioned rotated by 180° in comparison with first busbar 8. Each busbar 8, 10 has a first connection 12, a second connection 14, a third connection 16, and five further connections 18, whose cross section is the same, and which are connected to substantially L-shaped supporting body 22 extending in a longitudinal direction 20. Each connection 12, 14, 16, 18 is made L-shaped with the formation of a first leg 24 and a second leg 26, whereby each first leg 24 is parallel to circuit board 4 and rests against it. All first legs 24 are identical, therefore have the same shape, and are arranged in longitudinal direction 20. Busbars 8, 10 on one side are fastened to circuit board 4 by first leg 24 and, on the other side, are electrically contacted with its traces.

L-shaped supporting body 22 is arranged parallel to circuit board 4 and is spaced apart from it, whereby the leg parallel to longitudinal direction 20 has a stepped structure on the side facing the remaining leg. Each step is located at the contact point with the respective second leg 26 of connections 12, 14, 16, 18. The distance between adjacent connections 12, 14, 16, 18 and therefore also their particular second leg 26 is the same in longitudinal direction 20. Consequently, the length of each step is the same in longitudinal direction 20. The cross section of supporting body 22 is constant perpendicular to longitudinal direction 20 between adjacent connections 12, 14, 16, 18. The free end of the leg, having the stepped structure, of supporting body 22 forms the contact of first connection 12. Supporting body 22 thus merges into first connection 12.

Supporting body 22 has a first cross section between first connection 12 and second connection 14 and a second cross section between second connection 14 and third connection 16, whereby the first cross section is the same as the cross section of first connection 12 and smaller than the second cross section. The cross section between third connection 16 and further connection 18 adjacent hereto and between the adjacent further connections 18 increases continuously. Consequently, the cross section of the leg having the stepped structure in the area to the transition to the further leg of the L-shaped supporting body 22 is the greatest. The further leg has a round opening 28.

Busbars 8, 10 are each produced as a stamped/bent part of zinc-plated copper and therefore have a constant specific electrical resistance. As a result, the electrical resistance between first connection 12 and second connection 14 is greater than the electrical resistance between second connection 14 and third connection 16. The electrical resistance of each connection 12, 14, 16, 18 is hereby substantially the same. Consequently, a resistance string is realized by each busbar 8, 10. Each connection 12, 14, 16, 18 is electrically contacted by means of a trace of circuit board 4 with one of transistors 6, whereby first connection 12 is electrically contacted by one of transistors 6 with further connection 18 of second busbar 10, whose distance to opening 28 is the shortest. The further connection 18, adjacent hereto, of second busbar 10 is electrically contacted by means of another transistor of transistors 6 with second connection 14 of first busbar 8, etc. Consequently, both busbars 8, 10 are electrically connected by transistors 6, whereby transistors 6 are connected parallel to one another.

Transistors 6 are controlled by further traces, whereby during operation of electrical circuit 2 either all transistors 6 are switched to be conductive or not conductive. Alternatively, only a specific number of transistors 6 are switched to be conductive. An auxiliary unit of a commercial vehicle is supplied with current by electrical circuit 2, whereby an electrical voltage of 24 V is present at both busbars 8, 10. The electric current flowing across both busbars 8, 10 has a current strength of 280 A. Because of the decreasing cross section of supporting body 22 and of the thereby increased electrical resistance, the current strength carried by each connection 12, 14, 16, 18 is equal to 35 A.

Figure 2:
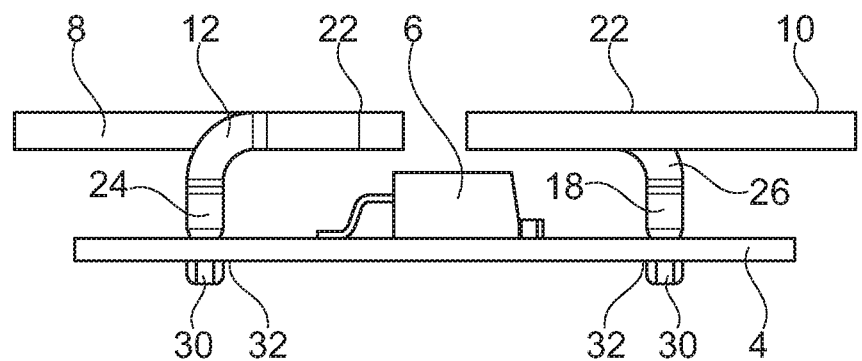
FIG. 2 shows the electrical circuit in a side view.

Electrical circuit 2 is shown in a side view in longitudinal direction 20 in FIG. 2. Transistors 6 are located between supporting body 22 and circuit board 4 and are therefore protected from damage by busbars 8, 10 and circuit board 4. In an embodiment (not shown) that is an alternative hereto, circuit board 4 is situated between supporting body 22 of at least one of busbars 8, 10. A contact pin 30, which is pressed into a corresponding second opening 32 of circuit board 4, is attached to each leg 24, parallel to circuit board 4, of each connection 12, 14, 16, 18. For mounting, in this case, a suitable tool is positioned on the particular first leg 24 and presses the particular busbar 8, 10 against circuit board 4, so that a force-locking connection between contact pin 30 and the associated second opening 32 is created. The electrical contact is also created hereby by contact pin 30 disposed perpendicular to longitudinal direction 20.

Figure 3:
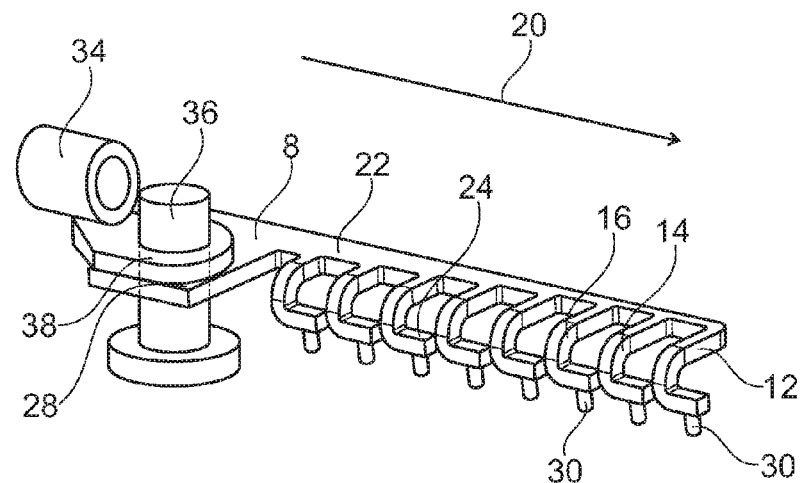
FIG. 3 shows perspectively one of the busbars.

First busbar 8 in the unmounted state is shown in FIG. 3. In other words, contact pins 30 are not fastened to circuit board 4. A cable lug 34 is attached to first busbar 8 by a threaded bolt 36, whereby the attachment occurs by a nut which is not shown here and is screwed onto the free end of threaded bolt 36. Threaded bolt 36 is partially positioned within opening 28 of supporting body 22 and projects furthermore through a corresponding opening 38 of cable lug 34. In the mounted state, a force-locking connection between cable lug 34 and first busbar 8 is created by the nut and threaded bolt 36, whereby a free end of a cable is electrically contacted with cable lug 34. A relatively low-impedance connection which is detachable again is created in this way between the cable and first busbar 8.

Figure 4:
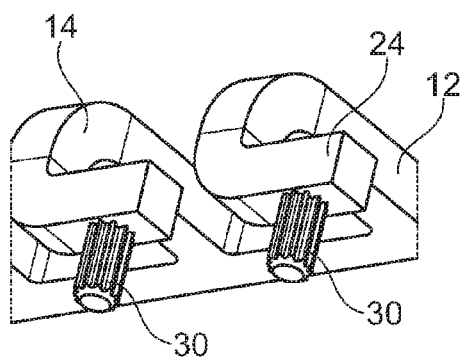
FIG. 4 shows connections of the busbar with a contact pin in each case.

First busbar 8 at its free end opposite to opening 28 is shown perspectively in a detail in FIG. 4. Each contact pin 30 has a ribbing. In other words, the cross section of each contact pin 30 parallel to circuit board 4 is star-shaped. When contact pin 30 is pressed into second openings 32, the surface structure of the particular contact pin 30 is deformed plastically and/or elastically by second openings 32, which leads to a force-locking connection between them.

Figure 5:
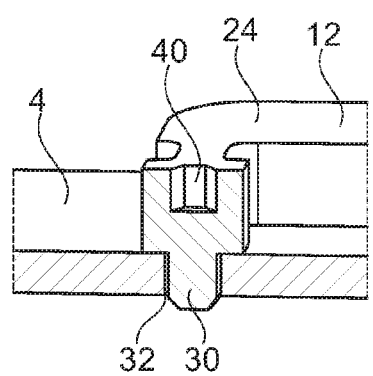
FIG. 5 shows an embodiment of the contact pin.

A further embodiment of the first leg 24 in a sectional illustration parallel to longitudinal direction 20 and perpendicular to circuit board 4 is shown in FIG. 5, whereby only first connection 12 is shown here. Contact pin 30 is produced by a joggle 40. In other words, first leg 24 is shaped by a suitable tool to create joggle 40.

Figure 6:
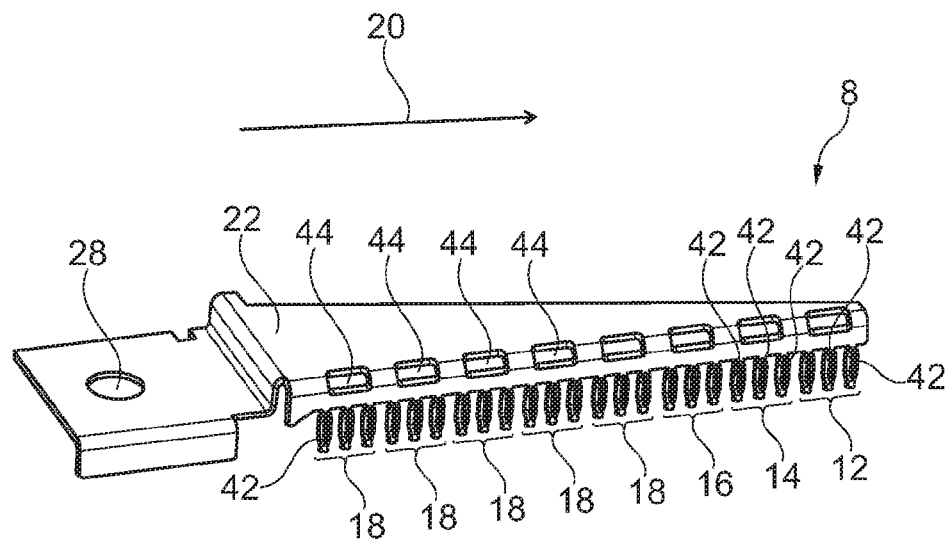
FIG. 6 shows perspectively a further embodiment of the busbar with connections each having a number of pins.

A further embodiment of first busbar 8 is shown perspectively in FIG. 6. When first busbar 8 is mounted on circuit board 4, this embodiment is also selected for second busbar 10, whereby second busbar 10 is again positioned turned by 180°. The contacting of transistors 6 is also the same. In other words, in comparison with the embodiment of electrical circuit 2, as shown in FIG. 1, only the first and second busbar 8, 10 and their connection to circuit board 4 have been changed.

First busbar 8 again comprises supporting body 22, which is formed substantially triangular. In the mounted stated, the triangular shape is disposed parallel to circuit board 4. The triangle is a right triangle, whereby one of the legs is parallel to longitudinal direction 20 and the remaining leg perpendicular to longitudinal direction 20. The length of the leg parallel to longitudinal direction 20 is three times the length of the remaining leg. In this case, the edge extending in longitudinal direction 20 is angled by 90° in the direction of circuit board 4, so that the cross section of supporting body 22, said cross section being perpendicular to longitudinal direction 20, is L-shaped. First connection 12, second connection 14, third connection 16, and the five further connection 18 are electrically contacted with the angled region of supporting body 22 and attached to it.

Figure 7:
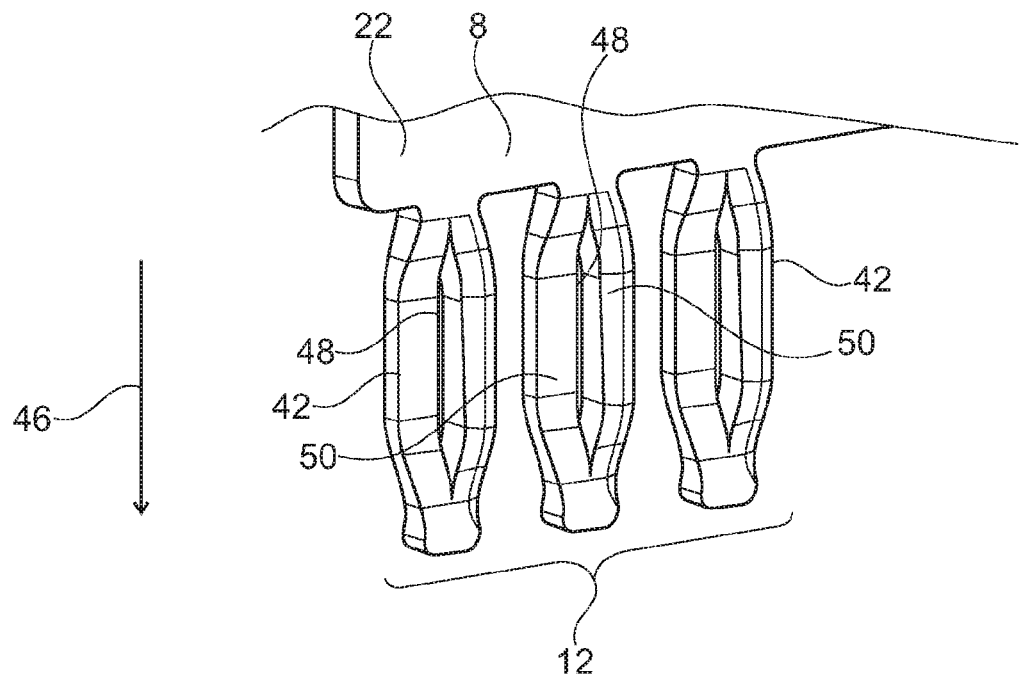
FIG. 7 shows a connection with a number of pins.

Each connection 12, 14, 16, 18 is formed by three pins 42 (FIG. 7). In the area of each connection 12, 14, 16, 18, supporting body 22 has rectangular recesses 44 along the angled edge. As a result, the cross section of supporting body 22, said cross section being perpendicular to longitudinal direction 20, in the area of connections 12, 14, 16, 18 is formed by two legs which are spaced apart and arranged perpendicular to one another. The cross section of supporting body 22 is L-shaped in the area free of recesses 44, whereby the length of the leg, which in the mounted state is parallel to circuit board 4, increases with an increasing distance to first connection 12. In other words, the first cross section, formed between first connection 12 and second connection 14, is smaller than the second cross section, formed between second connection 14 and third connection 16. A rectangle having opening 28 with a likewise angled edge is formed on the shorter leg of the triangular shape of supporting body 22. In the mounted state, cable lug 34 is again attached to the rectangular form by means of threaded bolt 36. First busbar 8 is also again made as a single piece as a stamped/bent part from tin-plated copper.

The free end, opposite to opening 28, of first busbar 8 with first connection 12 is shown perspectively as a detail in FIG. 7. First connection 12 comprises three pins 42, which run substantially perpendicular to longitudinal direction 20 and perpendicular to circuit board 4 in a press-in direction 46. A free end of each pin 42 is attached to supporting body 22 and is integral with it. Moreover, each of the identically fabricated pins 42 is slit and consequently has a slit 48, whereby the free ends of each pin 42 are free of slit 48. Two legs 50, which are bent in a C-shaped manner, are formed by slit 48. In this regard, the curvature of the two legs 50 of each pin 42 is opposite, so that the extension of pins 42 increases perpendicular to press-in direction 46 and perpendicular to longitudinal direction 20 in comparison with the thickness of supporting body 22. An elasticity of pins 42 is created by legs 50. In the mounted state, each pin 42 lies within a first opening of circuit board 4. In this case, legs 50 are pressed together by the first opening, and therefore their curvature is reduced. As a result, a force-locking connection is created between pins 42 and the first openings.

The invention is not limited to the exemplary embodiments described above. Rather, other variants of the invention can also be derived herefrom by the skilled artisan, without going beyond the subject matter of the invention. Particularly, further all individual features described in relation to the individual exemplary embodiments can also be combined with one another in a different manner, without going beyond the subject matter of the invention.

What is claimed is:

1. An electrical circuit comprising:
a circuit board on which a plurality of electrical and/or electronic components are mounted; and
a busbar that has a supporting body having a first side and second side opposite from the first side, and at least first, second, and third connections provided on the first side of the supporting body, the supporting body of the busbar being spaced apart from the circuit board, all of the first, second, and third connections of the busbar being electrically contacted both with the supporting body and with the circuit board, the supporting body extending in a longitudinal direction, the first side being parallel to the longitudinal direction, the second side of the supporting body being inclined relative to the first side,
wherein the supporting body has a first cross section between the first and second connections and a second cross section between the second and third connections, the first and second cross sections extending in a lateral direction perpendicular to the longitudinal direction,
wherein a width of the busbar continuously decreases in the longitudinal direction over a substantial portion of an entire length of the busbar, and
wherein the first cross section is smaller than the second cross section.

2. The electrical circuit according to claim 1, wherein the busbar is formed as a single piece, is a stamped/bent part, and/or has nickel-plated copper.

3. The electrical circuit according to claim 1, wherein one end of the supporting body is the contact of the first connection, and/or wherein one end of the supporting body has an opening in which a threaded bolt is situated at least partially via which a cable lug is attached to the supporting body.

4. The electrical circuit according to claim 1, wherein the busbar comprises a plurality of further connections, wherein the supporting body has a cross section between adjacent connections, and wherein each cross section is increased with an increasing distance to the first connection.

5. The electrical circuit according to claim 1, wherein the cross section of the connections is substantially the same, and/or wherein a distance between contacts of adjacent connections is substantially the same.

6. The electrical circuit according to claim 1, wherein each connection has a plurality of pins, which are pressed into first openings of the circuit board.

7. The electrical circuit according to claim 1, wherein the supporting body has a bent section extending from the first side towards the circuit board such that the first cross section and the second cross section are each L-shaped, and wherein the cross section of the supporting body in an area of contacts of the connections is formed by two spaced apart legs.

8. A busbar of an electrical circuit according to claim 1.

9. The electric circuit according to claim 1, wherein the supporting body has a right triangular shape, the first side is on one of two sides forming the right angle.

10. A busbar comprising:
a base section;
a supporting body having a right triangular shape; and
at least one connection formed on the supporting body,
wherein the supporting body has a first side and a second side forming the right angle, the first side extending in a longitudinal direction, the second side extending in the lateral direction,
wherein the at least one connection extends from the first side of the supporting body in a thickness direction perpendicular to the longitudinal and lateral directions, and the base section is connected to the second side of the supporting body and extends in the longitudinal direction.

11. The busbar of claim 10, wherein the base section includes an opening.

12. The busbar of claim 10, wherein each of the at least one connection includes an opening formed by two spaced apart legs.

13. The busbar of claim 10, wherein the supporting body has a side wall extending from the first side in the thickness direction, forming an L-shaped cross section in the lateral direction of the supporting body, and the at least one connection is formed on the bent section.

14. The busbar of claim 13, wherein at least one recess is formed on a bent area formed between the supporting body and the side wall.

* * * * *